United States Patent
U'Ren et al.

(10) Patent No.: US 6,639,256 B2
(45) Date of Patent: Oct. 28, 2003

(54) STRUCTURE FOR ELIMINATING COLLECTOR-BASE BAND GAP DISCONTINUITY IN AN HBT

(75) Inventors: Greg D. U'Ren, Corona del Mar, CA (US); Klaus F. Schuegraf, Aliso Viejo, CA (US); Marco Racanelli, Santa Ana, CA (US)

(73) Assignee: Newport Fab, LLC, Newport Beach, CA (US)

( * ) Notice: Subject to any disclaimer, the term of this patent is extended or adjusted under 35 U.S.C. 154(b) by 26 days.

(21) Appl. No.: 10/066,872

(22) Filed: Feb. 4, 2002

(65) Prior Publication Data

US 2003/0146449 A1 Aug. 7, 2003

(51) Int. Cl.$^7$ .......................................... H01L 31/0328
(52) U.S. Cl. ........................ 257/197; 257/592; 257/616
(58) Field of Search ................................ 257/197, 200, 257/201, 565, 198, 592, 593, 616

(56) References Cited

U.S. PATENT DOCUMENTS

| | | | | |
|---|---|---|---|---|
| 885,614 A | * | 4/1908 | Hand | 411/136 |
| 6,492,711 B1 | * | 12/2002 | Takagi et al. | 257/593 |
| 2002/0160587 A1 | * | 10/2002 | Jagannathan et al. | 438/510 |
| 2002/0163013 A1 | | 11/2002 | Toyoda et al. | |
| 2002/0182423 A1 | * | 12/2002 | Chu et al. | 428/446 |

* cited by examiner

*Primary Examiner*—Tuan H. Nguyen
(74) *Attorney, Agent, or Firm*—Farjami & Farjami LLP

(57) ABSTRACT

According to one exemplary embodiment, a heterojunction bipolar transistor comprises a base having a concentration of germanium, where the concentration of germanium decreases between a first depth and a second depth in the base. According to this exemplary embodiment, the base of the heterojunction bipolar transistor further comprises a concentration of a diffusion suppressant of a base dopant, where the concentration of the diffusion suppressant decreases between a third depth and a fourth depth so as to counteract a change in band gap in the base between the first depth and the second depth. For example, the diffusion suppressant can be carbon and the base dopant can be boron. For example, the concentration of diffusion suppressant may decrease between the third depth and fourth depth so as to counteract the change in band gap at approximately the second depth.

12 Claims, 5 Drawing Sheets

STRUCTURE FOR ELIMINATING COLLECTOR-BASE BAND GAP DISCONTINUITY IN AN HBT

BACKGROUND OF THE INVENTION

1. Field of the Invention

The present invention is generally in the field of fabrication of semiconductor devices. More particularly, the present invention is in the field of fabrication of heterojunction bipolar transistors.

2. Related Art

In a silicon-germanium ("SiGe") heterojunction bipolar transistor ("HBT"), a thin silicon-germanium layer is grown as the base of a bipolar transistor on a silicon wafer. The SiGe HBT has significant advantages in speed, frequency response, and gain when compared to a conventional silicon bipolar transistor. Cutoff frequencies in excess of 100 GHz, which are comparable to the more expensive gallium-arsenide based devices, have been achieved for the SiGe HBT.

The higher gain, speed and frequency response of the SiGe HBT are possible due to certain advantages of silicon-germanium, such as a narrower band gap and reduced resistivity. These advantages make silicon-germaniun devices more competitive than silicon-only devices in areas of technology where high speed and high frequency response are required.

The advantages of high speed and high frequency response discussed above require the realization of a thin highly doped base layer in the NPN SiGe HBT. For example, boron is commonly utilized to provide P-type doping of the base in an NPN silicon-germanium HBT. However, boron has a tendency to diffuse in the base. In other words, the boron profile in the base has a tendency to widen, thus undesirably widening the base. Boron diffusion is further accelerated during subsequent thermal processing steps that occur in the fabrication of the NPN SiGe HBT. The increased boron diffusion can severely degrade the high frequency performance of the NPN SiGe HBT. Thus, suppression of boron diffusion presents a major challenge in the fabrication of a NPN SiGe HBT.

One method of suppressing boron diffusion in the base of the NPN SiGe HBT is by adding carbon in the base. For example, a concentration of greater than $1*10^{19}$ of carbon atoms per cubic centimeter can be added in the base of the NPN SiGe HBT at the point where the concentration of boron peaks. Although adding carbon in the base effectively suppresses boron diffusion, the addition of carbon has the undesirable effect of causing a band gap discontinuity at the collector-base junction. As a result of the band gap discontinuity at the collector-base junction, the electrical performance of the NPN SiGe HBT is accordingly diminished. For example, the above band gap discontinuity can increase the base transit time of electrons moving from the emitter to the base, thereby limiting the cut-off frequency of the NPN SiGe HBT.

Graph 100 in FIG. 1 shows conventional exemplary boron, carbon, and germanium profiles in a base in an NPN SiGe HBT. Graph 100 includes concentration level axis 102 plotted against depth axis 104. Concentration level axis 102 shows relative concentration levels of boron, carbon and germanium. Depth axis 104 shows increasing depth into the base, starting at the top surface of the base, i.e. at the transition from emitter to base in the NPN SiGe HBT. The top surface of the base in the NPN SiGe HBT corresponds to "0" on depth axis 104. The bottom surface of the base, i.e. the collector-base junction, corresponds to depth 122 on depth axis 104.

Graph 100 also includes boron profile 106, which shows the concentration of boron in the base, plotted against depth, i.e. distance into the base. Boron profile 106 includes peak boron concentration level 108, which occurs at depth 114. Graph 100 further includes carbon profile 112, which shows the concentration of carbon in the base, plotted against depth. The concentration of carbon in carbon profile 112 increases abruptly from 0.0 to a constant level at depth 114, and remains at a constant level from depth 114 to depth 122. At depth 122, the carbon concentration level decreases abruptly to 0.0.

Graph 100 further includes germanium profile 116, which shows the concentration of germanium in the base of the present exemplary NPN SiGe HBT, plotted against depth. Germanium profile 116 begins at 0.0 concentration level at depth 110 and increases to depth 118. Germanium profile 116 maintains a constant concentration level from depth 118 to depth 120. At depth 120, germanium profile 116 decreases to 0.0 concentration level at depth 122. Thus, a concentration of carbon is added in the base of the NPN SiGe HBT at depth 114, which corresponds to peak boron concentration level 108.

Graph 200 in FIG. 2 shows a conventional exemplary band gap curve in the base and at the collector-base junction in the conventional exemplary NPN SiGe HBT. Graph 200 shows band gap curve 202, which shows the change in band gap caused by carbon profile 112 and germanium profile 116 in FIG. 1 in the base in the present exemplary NPN SiGe HBT. Graph 200 includes change in band gap axis 208 plotted against depth axis 204. It is noted that "0" on change in band gap axis 208 refers to the band gap of a reference base comprising only silicon, i.e. a silicon-only base. It is also noted that an upward move on band gap curve 202 indicates a decrease in the band gap of the present exemplary NPN SiGe HBT relative to the band gap of a silicon-only base. Conversely, a downward move on band gap curve 202 indicates an increase in the band gap relative to the band gap of a silicon-only base.

Depth axis 204 corresponds to depth axis 104 in FIG. 1. In particular, depths 210, 214, 218, 220, and 222, respectively, correspond to depths 110, 114, 118, 120, and 122 in FIG. 1. At depth 210, band gap curve 202 begins to decrease. As is known in the art, an increase in the concentration of germanium in a base of an NPN SiGe HBT results in a decrease in band gap. Thus, band gap curve 202 decreases from depth 210 to just prior to depth 214 as the result of a ramp up in concentration of germanium. At depth 214, band gap curve 202 indicates an abrupt increase in band gap. This step increase in band gap corresponds to the addition of carbon in the base at depth 114 in FIG. 1.

Band gap curve 202 decreases from depth 214 to depth 218 as the result of a ramp up in concentration of germanium. Between depth 218 and depth 220, band gap curve 202 remains constant as a result of a constant concentration of germanium. Between depth 220 and depth 223, band gap curve 202 increases as a result of a ramp down in concentration of germanium. At depth 223, band gap curve 202 continues to increase to band gap level 224 as a result of a constant concentration of carbon and the ramp down in concentration of germanium.

At approximately depth 222, i.e. at the approximate collector-base junction of exemplary NPN SiGe HBT, band gap curve 202 abruptly decreases to the reference band gap of a silicon-only base. Distance 226 refers to the distance between depth 223, i.e. the depth at which band gap curve 202 crosses depth axis 204, and approximately depth 222, i.e. the approximate depth where band gap curve 202 abruptly decreases to the reference band gap of a silicon-only base. For example, distance 226 can be approximately 50.0 to 100.0. The band gap discontinuity, i.e. the abrupt decrease in band gap, at approximately depth 222 is caused by the abrupt decrease in the concentration level of carbon at depth 222. As such, the rapid decrease in carbon at the collector-base junction of conventional exemplary NPN SiGe HBT results in an undesirable band gap discontinuity at the collector-base junction.

Thus, there is a need in the art to provide a narrow base in a SiGe HBT by suppressing dopant diffusion in the base without causing an undesirable band gap discontinuity at the collector-base junction.

SUMMARY OF THE INVENTION

The present invention is directed to method and structure for eliminating collector-base band gap discontinuity in an HBT. The present invention overcomes the need in the art for a narrow base in a SiGe HBT by suppressing dopant diffusion in the base without causing an undesirable band gap discontinuity at the collector-base junction.

According to one exemplary embodiment, a heterojunction bipolar transistor comprises a base having a concentration of germanium, where the concentration of germanium decreases between a first depth and a second depth in the base. For example, the concentration of germanium may decrease at a linear rate between the first depth and the second depth.

According to this exemplary embodiment, the base of the heterojunction bipolar transistor further comprises a concentration of a diffusion suppressant of a base dopant, where the concentration of the diffusion suppressant decreases between a third depth and a fourth depth so as to counteract a change in band gap in the base between the first depth and the second depth. For example, the diffusion suppressant can be carbon and the base dopant can be boron. The concentration of the diffusion suppressant, for example, may decrease at a linear rate between the third depth and the fourth depth, and the third depth may be situated in a germanium plateau region in the base. For example, the concentration of the diffusion suppressant may decrease between the third depth and the fourth depth so as to counteract the change in band gap in the base at approximately the second depth.

DETAILED DESCRIPTION OF THE INVENTION

The present invention is directed to method and structure for eliminating collector-base band gap discontinuity in an HBT. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 3:
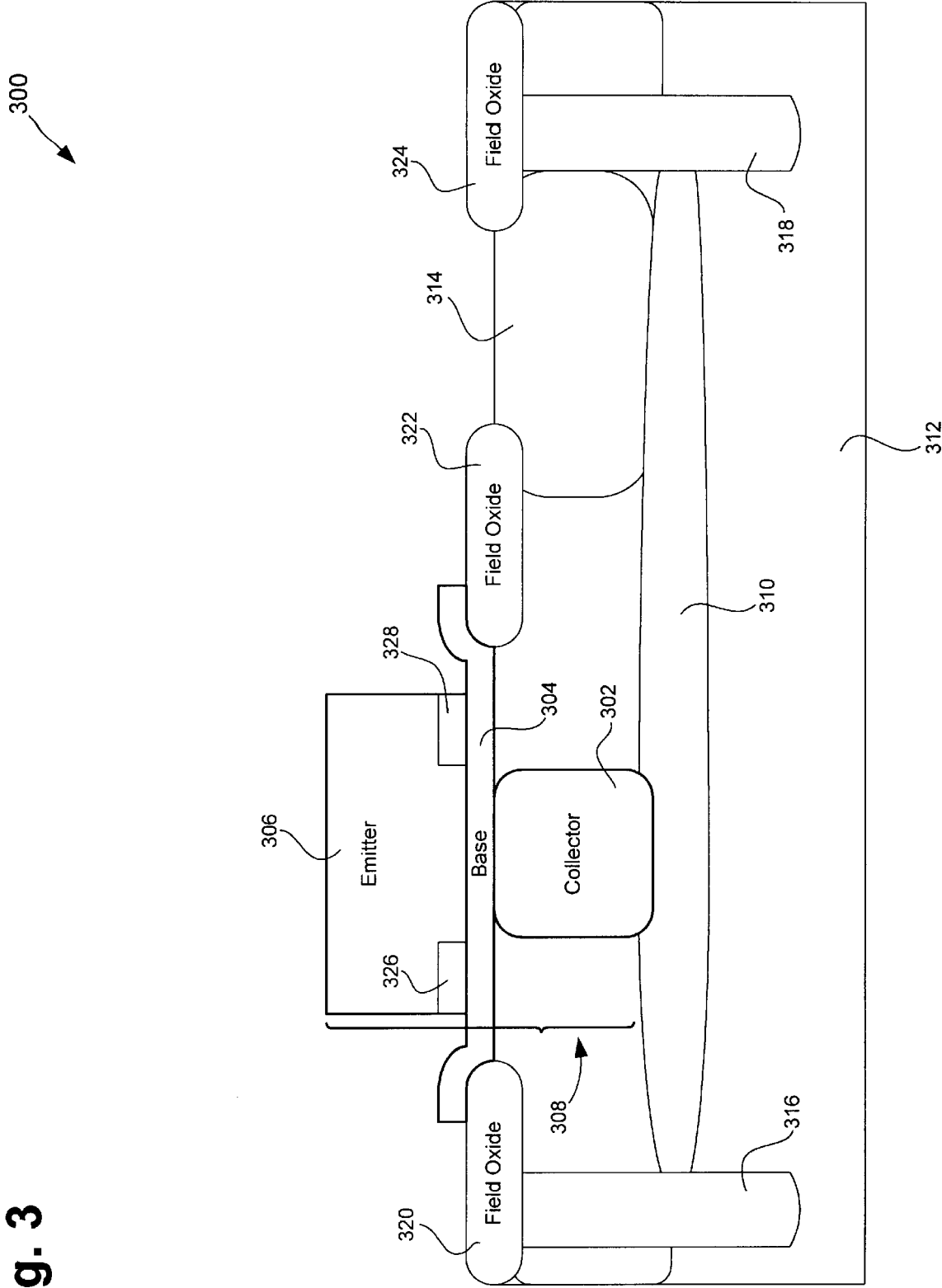
FIG. 3 illustrates an exemplary structure, including an exemplary NPN SiGe HBT, in accordance with one embodiment of the present invention.

FIG. 3 shows a cross-sectional view of structure 300, which is utilized to describe one embodiment of the present invention. Certain details and features have been left out of FIG. 3 that are apparent to a person of ordinary skill in the art. Although structure 300 illustrates an exemplary NPN SiGe HBT, the present invention manifestly applies to other similar or related structures, such as PNP HBTs. Structure 300 includes collector 302, base 304, and emitter 306. Collector 302 is N-type single crystal silicon, which might be deposited epitaxially using a reduced pressure chemical vapor deposition ("RPCVD") process in a manner known in the art. Base 304 is a P-type silicon-germanium single crystal which might be deposited epitaxially in a "nonselective" RPCVD process. As seen in FIG. 3, base 304 is situated on top of, and forms a junction with, collector 302. In the present exemplary embodiment, emitter 306, which is situated above and forms a junction with base 304, comprises N-type polycrystalline silicon. Collector 302, base 304, and emitter 306 thus form the present exemplary NPN SiGe HBT, which is generally referred to by numeral 308 in FIG. 3.

As seen in FIG. 3, buried layer 310, which comprises N+ type material, i.e. heavily doped N-type material, is formed in silicon substrate 312 in a manner known in the art. Collector sinker 314, which also comprises N+ type material, is formed by wit diffusion of heavily concentrated dopants from the surface of collector sinker 314 down to buried layer 310. Buried layer 310, along with collector sinker 314, provide a low resistance electrical pathway from collector 302 through buried layer 310 and collector sinker 314 to a collector contact (not shown in FIG. 3).

As further seen in FIG. 3, deep trench structures 316 and 318 and field oxide structures 320, 322, and 324 provide electrical isolation from other devices on silicon substrate 312. Deep trench structures 316 and 318 and field oxide structures 320, 322, and 324 comprise silicon oxide material and are formed in a manner known in the art. Dielectric segments 326 and 328, which can comprise silicon oxide, provide electrical isolation between emitter 306 and base 304.

By way of background, characteristics and functionality of the present exemplary NPN SiGe HBT 308 are affected and can be tailored by varying steps of the fabrication process. One useful tool for controlling the resultant performance characteristics of NPN SiGe HBT 308 is the dopant profiles. In particular, it is desirable to accurately control the dopant profiles of base 304 to achieve a desired NPN SiGe HBT performance. In the present application, a dopant profile in base 304 is also referred to as a concentration of base dopant, such as boron, in base 304.

Figure 4:
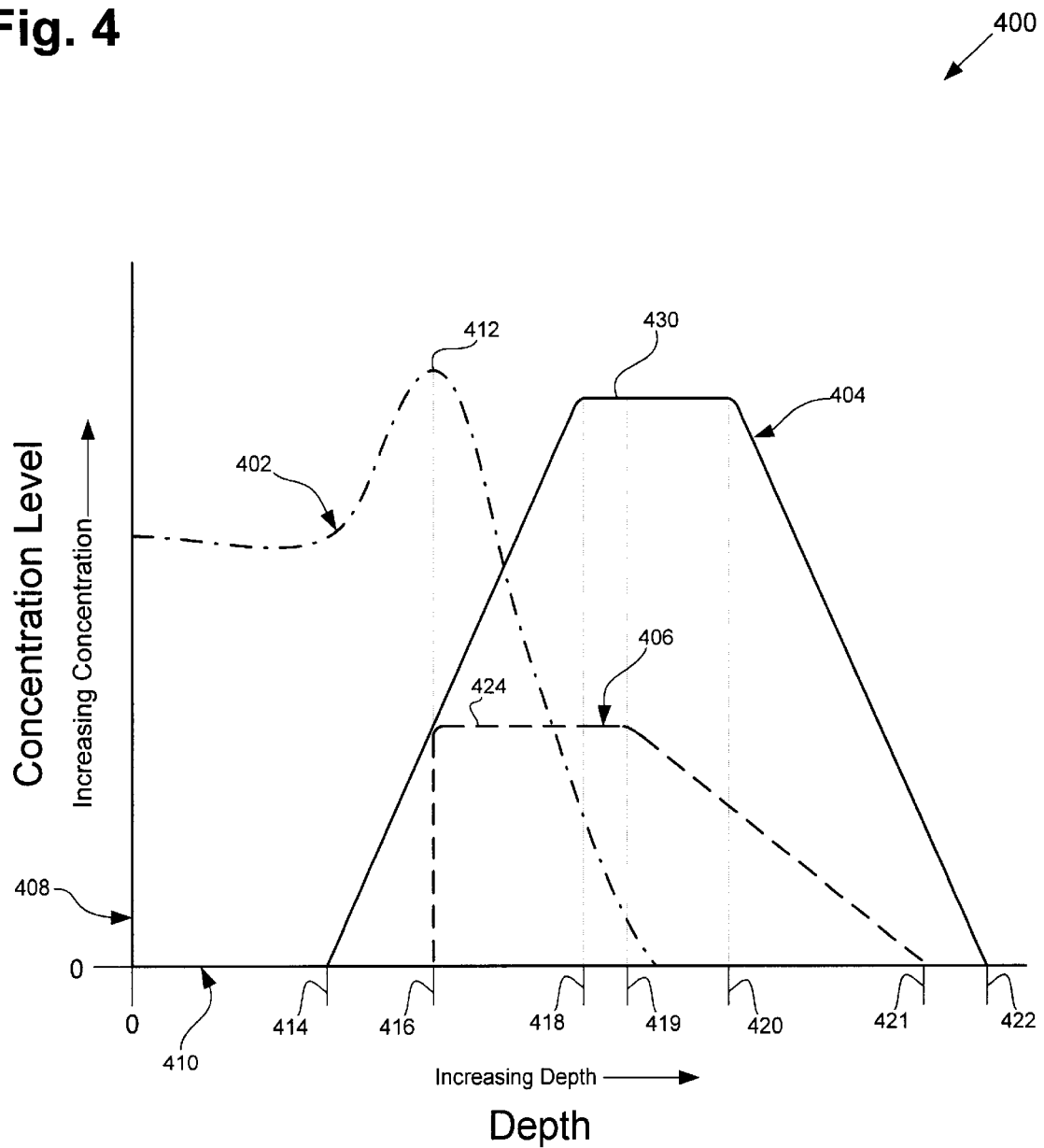
FIG. 4 is a graph showing boron, carbon, and germanium profiles in the base of exemplary NPN SiGe HBT in accordance with one embodiment of the present invention.

Graph 400 in FIG. 4 shows exemplary boron, germanium, and carbon profiles in the base of an exemplary NPN SiGe HBT in accordance with one embodiment of the present invention. In particular, boron profile 402, germanium profile 404, and carbon profile 406, respectively, in graph 400 show boron, germanium, and carbon profiles in base 304 in FIG. 3. Graph 400 includes concentration level axis 408 plotted against depth axis 410. Concentration level axis 408 shows relative concentration levels of boron, germanium, and carbon respectively, in boron profile 402, germanium profile 404, and carbon profile 406.

Depth axis 410 shows increasing depth into base 304 in FIG. 3, starting at the top surface of base 304. Thus, "0" on depth axis 410 indicates the approximate transition from emitter 306 to base 304. Additionally, depth 422 on depth axis 410 indicates the collector-base junction, i.e. the transition from base 304 to collector 302, of NPN SiGe HBT 308 in FIG. 3. Boron profile 402 shows the concentration of boron in base 304, plotted against depth, i.e. distance into base 304. Boron profile 402 includes boron peak 412, which represents the peak concentration level of boron in base 304. Boron peak 412 occurs at depth 416 in base 304.

It is noted that boron is used as an exemplary P-type dopant in the present exemplary NPN HBT for the purpose of illustrating the present invention by way of a specific example. However, the principles of the present invention apply equally to an NPN HBT using a different P-type dopant in its base and even to a PNP HBT using an N-type dopant in its base.

Continuing with graph 400 in FIG. 4, germanium profile 404 shows the concentration of germanium in base 304, plotted against depth, i.e. distance into base 304. Germanium profile 404 begins at depth 414 in base 304, and it (i.e. germanium profile 404) ends at depth 422, which corresponds to the collector-base junction, i.e. the transition from base 304 to collector 302 in FIG. 3. In one embodiment, depth 422 substantially corresponds to the collector-base junction of exemplary NPN SiGe HBT 308. The germanium concentration level in base 304 starts at 0.0 germanium concentration at depth 414 and increases to germanium concentration level 430 at depth 418.

By way of background, increasing the concentration of germanium in a base of an NPN SiGe HBT results in a reduction in band gap in the base. For example, 10.0 atomic percent of germanium is equivalent to a reduction in band gap of approximately 10.0 meV. The reduction in band gap allows an electric field to build up in the base, which produces the desirable result of increasing performance of the NPN SiGe HBT. In addition, increasing the concentration of germanium in a base of an NPN SiGe HBT correspondingly increases the in-plane stress and changes the electronic band structure favorably to enhance carrier mobility, thereby increasing performance of the NPN SiGe HBT.

Continuing with graph 400, the ramp up of germanium concentration builds a desirable electric field in base 304. For example, the distance between depth 414 and depth 418 can be approximately 200.0 Angstroms. When, for example, germanium ramps up to a concentration level of 20.0 atomic percent at depth 418, which corresponds to a band gap change of approximately 20.0 meV over 200.0 Angstroms (10.0 atomic percent of germanium is equivalent to a reduction in band gap of approximately 10.0 meV). The corresponding electric field gradient would be approximately 20.0 meV/200.0 Angstroms or approximately $1.00*10^4$ volts per centimeter.

At depth 418, the concentration of germanium reaches concentration level 430. The concentration level of germanium remains at germanium concentration level 430 from depth 418 to depth 420. For example, germanium concentration level 430 can be 20.0 atomic percent of germanium. In the present application, it is noted that the constant germanium concentration level between depth 418 and depth 420 is also referred to as the "germanium plateau region." Between depth 420 and depth 422, the germanium concentration level decreases from germanium concentration level 430 at depth 420 to a germanium concentration level of 0.0 at depth 422.

Continuing with graph 400, carbon profile 406 shows the concentration of carbon in base 304, plotted against depth, i.e. distance into base 304. It is noted that carbon is also referred to as a "diffusion suppressant" or as "impeding" diffusion in the present application. As shown in FIG. 4, carbon profile 406 begins at depth 416, where a concentration of carbon is introduced into base 304. In other words, carbon doping begins at depth 416 in base 304.

Carbon is introduced into a base of the present exemplary NPN SiGe HBT to suppress boron diffusion, which can undesirably increase the effective width of the base. For example, the thermal annealing process utilized in the fabrication of the NPN SiGe HBT can cause boron to diffuse into adjoining silicon regions of the NPN SiGe HBT, which can severely degrade the performance of the NPN SiGe HBT. Although carbon effectively suppresses boron diffusion, the addition of carbon into the base results in an undesirable increase in band gap in the base. For example, an introduction of 1.0 atomic percent of carbon in the base increases the band gap by approximately 10.0 milli-electron volts (meV).

Continuing with graph 400, at depth 416, the concentration of carbon increases abruptly from 0.0 concentration level to carbon concentration level 424. For example, carbon concentration level 424 can be approximately 0.5 atomic percent of carbon. The increase in concentration of carbon at depth 416 also results in a corresponding increase in band gap in base 304. For example, the addition of 0.5 atomic percent of carbon at depth 416 can result in an approximate 5.0 meV increase in band gap in base 304. The concentration of carbon remains at carbon concentration level 424 down to depth 419. According to an embodiment of the present invention, at depth 419, the concentration of carbon is decreased from carbon concentration level 424 to 0.0 carbon concentration at depth 421.

As shown in graph 400, depth 419, i.e. the depth at which the concentration of carbon starts to ramp down, is situated in the germanium plateau region, which extends from depth 418 to depth 420 as discussed above. It is appreciated that the concentration of carbon can start to ramp down at any depth in the germanium plateau region or at any depth in the germanium ramp down region. In one embodiment, the concentration of carbon can start to ramp down at depth 418, i.e. the start of the germanium plateau region.

As discussed above, the addition of carbon in base 304 results in an increase in band gap. Likewise, a decrease in carbon concentration in base 304 results in a corresponding decrease in band gap. Also, as discussed above, an increase in concentration of germanium in base 304 results in a decrease in band gap. Likewise, a decrease in concentration of germanium in base 304 results in a corresponding increase in band gap. Thus, by appropriately ramping down the carbon concentration between depth 419 and depth 421, the present invention partially offsets the increase in band gap resulting from the decrease in germanium concentration between depth 420 and depth 422. As a result, the band gap in base 304 increases relative to a reference band gap of a "silicon-only" base, i.e. the band gap of a base comprising only silicon, at approximately depth 422, while substantially eliminating any band gap discontinuity, i.e. a decrease in band gap, at approximately depth 422. In one embodiment, the band gap discontinuity, i.e. a decrease in band gap, is prevented at a depth approximately equal to depth 422.

Thus, the present invention provides the advantage of preventing a band gap discontinuity at approximately depth 422 by ramping down the carbon concentration between depth 419 and depth 421 to counteract the effect of a ramp down of germanium concentration between depth 420 and depth 422. Furthermore, the present invention preserves the advantage of a narrow boron profile in base 304 by utilizing carbon to prevent the diffusion of boron from increasing the effective size, i.e. widening, base 304.

Figure 5:
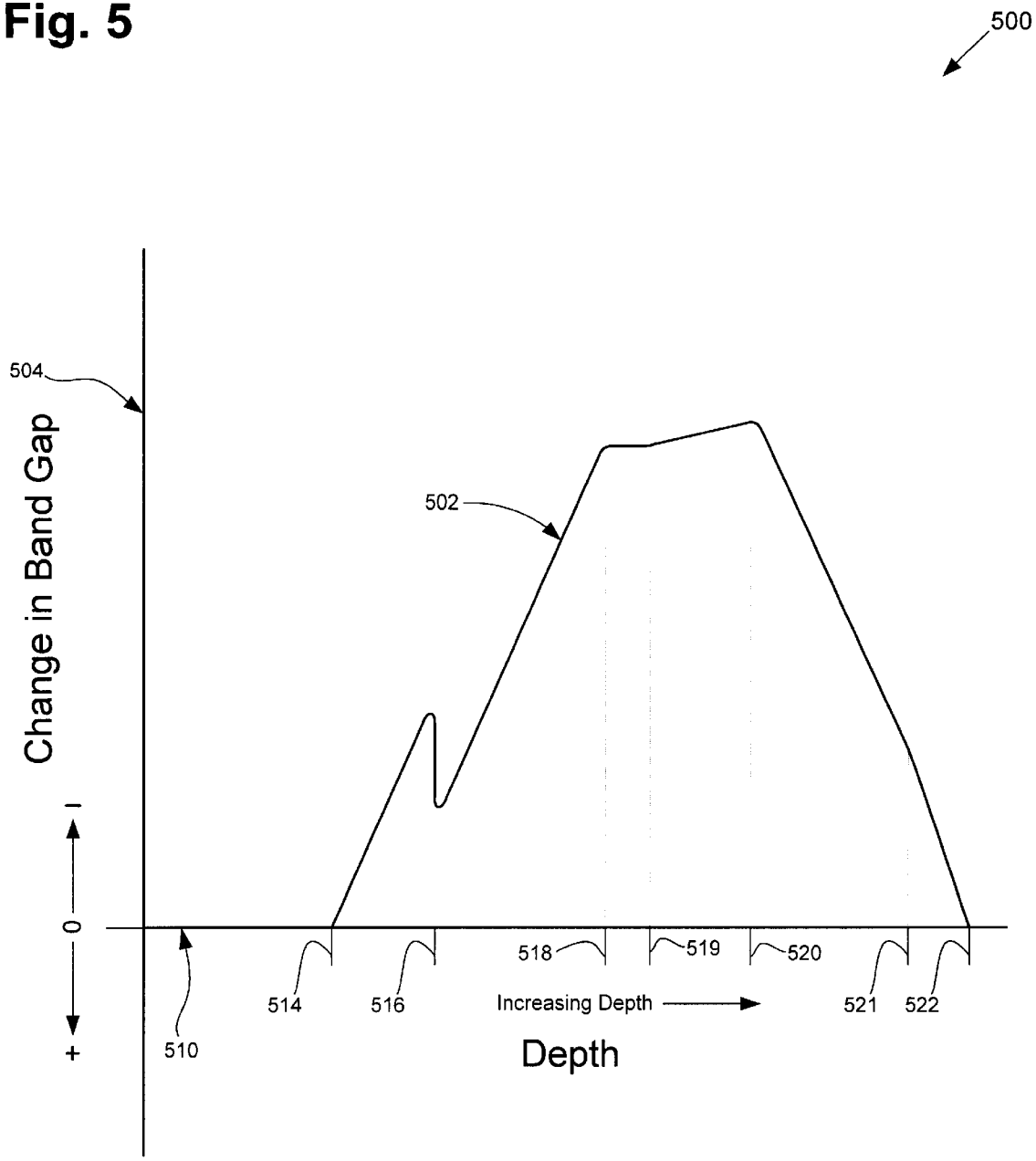
FIG. 5 is a graph showing a change in band gap of the base and collector-base junction of the exemplary NPN SiGe HBT of FIG. 4 in accordance with one embodiment of the present invention.

Graph 500 in FIG. 5 shows an exemplary band gap curve in the base in the exemplary NPN SiGe HBT in accordance with one embodiment of the present invention. Graph 500 shows band gap curve 502, which shows the change in band gap caused by carbon profile 406 and germanium profile 404 in FIG. 4 in base 304 in FIG. 3. Graph 500 includes change in band gap axis 504 plotted against depth axis 510. It is noted that "0" on change in band gap axis 504 refers to the band gap of a reference base comprising only silicon, i.e. a "silicon-only" base. It is also noted that an upward move on band gap curve 502 indicates a decrease in the band gap of base 304 relative to the band gap of a silicon-only base. Conversely, a downward move on band gap curve 502 indicates an increase in the band gap of base 304 relative to the band gap of a silicon-only base.

Depth axis 510 corresponds to depth axis 410 in FIG. 4. In particular, depths 514, 516, 518, 520, 521, and 522, respectively, on depth axis 510 correspond to depths 414, 416, 418, 420, 421, and 422 on depth axis 410 in FIG. 4. As shown in graph 500, band gap curve 502 indicates a decrease in band gap of base 304 from depth 514 to depth 516. The decrease in band gap from depth 514 to depth 516 is caused by the increase in germanium concentration from depth 414 to depth 416 in FIG. 4. At depth 516, band gap curve 502 indicates an abrupt increase in band gap caused by the abrupt increase in carbon concentration at depth 416.

As shown in graph 500, band gap curve 502 indicates a decrease in band gap from depth 516 to depth 518 as a result of an increase in germanium concentration from depth 416 to depth 418 in FIG. 4. Band gap curve 502 shows constant level between depth 518 and depth 519, which is caused by the constant concentration level of germanium between depth 418 and depth 419 in FIG. 4. Band gap curve 502 indicates a decrease in band gap between depth 519 and depth 520. The decrease in band gap between depth 519 and depth 520 is caused by the decrease in carbon concentration between depth 419 and depth 420.

Band gap curve 502 indicates an increase in band gap between depth 520 and depth 521. The increase in band gap between depth 520 and depth 521 is caused by the interaction of the invention's ramp down in carbon concentration from depth 419 to depth 421 and the ramp down in germanium concentration from depth 420 to depth 421. Band gap curve 502 indicates an increase in band gap between depth 521 and depth 522. The increase in band gap between depth 521 and depth 522 is caused by the decrease in germanium concentration between depth 421 and depth 422. Thus, the present invention's ramp down in carbon concentration from depth 419 to depth 421 results in a band gap curve with substantially no discontinuity at approximately depth 522, i.e. the approximate collector-base junction of exemplary NPN SiGe HBT 308.

Figure 1:
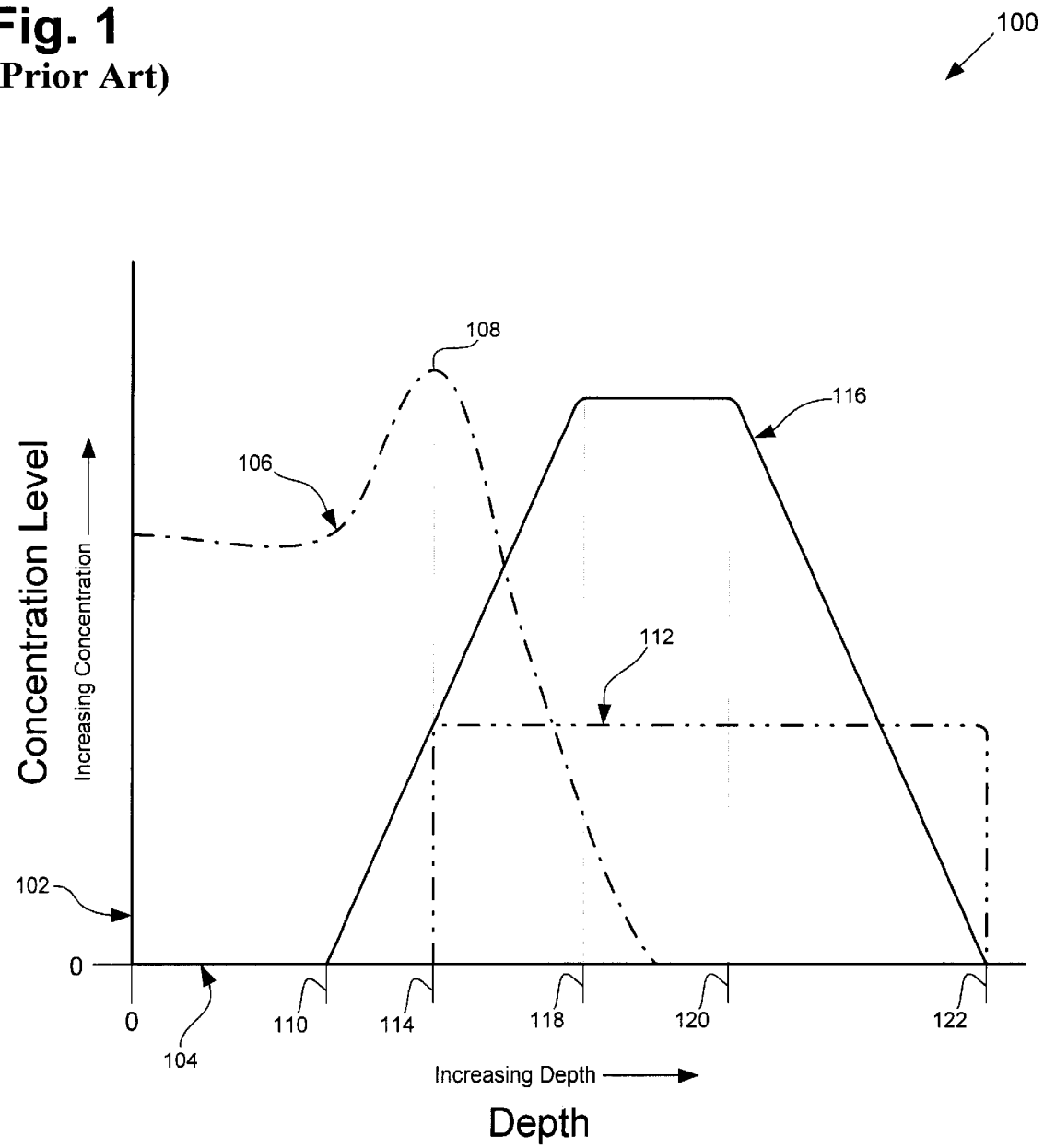
FIG. 1 illustrates a graph showing boron, carbon, and germanium profiles in a base in a conventional exemplary NPN SiGe HBT.
Figure 2:
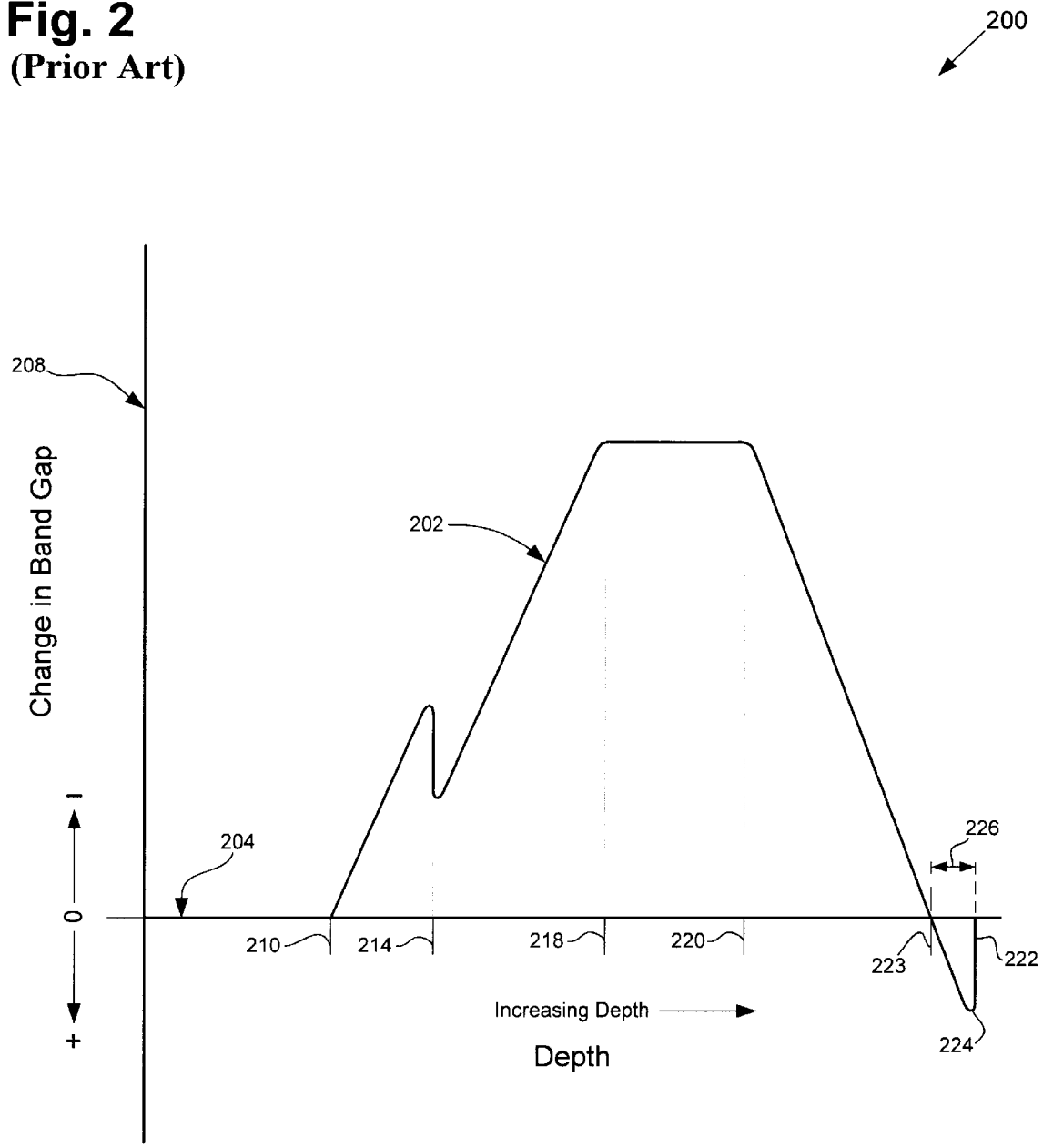
FIG. 2 illustrates a graph showing a change in band gap of the base and collector-base junction in a conventional exemplary NPN SiGe HBT of FIG. 1.

In contrast to the present invention, conventional band gap curve 202 in FIG. 2 shows an increase in band gap from depth 220 to depth 222, followed by an abrupt decrease, i.e. a discontinuity, in band gap at approximately depth 222. Thus, conventional band gap curve 202 in FIG. 2 shows an undesirable discontinuity in band gap at approximately depth 222, resulting from the abrupt decrease in carbon in the base of the exemplary NPN SiGe HBT.

Thus, by providing a decrease in carbon from depth 419 to depth 421 to compensate for a decrease in germanium from depth 420 to depth 422, the present invention prevents a decrease in band gap at approximately depth 522. Accordingly, the present invention provides the advantage of a decreasing electric field, i.e. a decreasing electric field without a discontinuity, at approximately depth 522, i.e. the approximate collector-base junction of NPN SiGe HBT 308. The elimination of the discontinuity in the electric field at approximately depth 522 provided by the present invention results in an increase in performance of NPN SiGe HBT 308.

From the above description of the invention it is manifest that various techniques can be used for implementing the concepts of the present invention without departing from its scope. It is noted that although reference is made to germanium as a band gap altering material throughout the present application, the principles of the present invention apply to any other band gap altering material which causes a change in the band gap where such change is used to counteract an opposing change caused by another material, such as a diffusion suppressant like carbon.

While the invention has been described with specific reference to certain embodiments, a person of ordinary skills in the art would recognize that changes can be made in form and detail without departing from the spirit and the scope of the invention. For example, the principles of the present invention are also applicable to NPN SiGe HBTs using a P-type dopant other than boron, or using a diffusion suppressant other than carbon. Moreover, the present invention is applicable to NPN HBTs using semiconductors other than silicon or germanium. Further, the present invention's principles can also be applied to PNP SiGe HBTs or to non-SiGe PNP HBTs.

As such, the described embodiments are to be considered in all respects as illustrative and not restrictive. It should also be understood that the invention is not limited to the particular embodiments described herein, but is capable of many rearrangements, modifications, and substitutions without departing from the scope of the invention. For example, the specified layouts, dimensions, and doping levels are provided solely for the purpose of illustrating the present invention by way of a specific example and such dimensions, layouts, and doping levels can be manifestly varied without departing from the scope of the present invention.

Thus, method and structure for eliminating collector-base band gap discontinuity in an HBT have been described.

What is claimed is:

1. A heterojunction bipolar transistor comprising:

a base having a concentration of a first band gap altering material, said concentration of said first band gap altering material decreasing between a first depth in said base and a second depth in said base;

said base having a concentration of a diffusion suppressant of a base dopant, said concentration of said diffusion suppressant decreasing between a third depth in said base and a fourth depth in said base so as to counteract a change in band gap in said base between said first depth and said second depth, said second depth being greater than said fourth depth.

2. The heterojunction bipolar transistor of claim 1 wherein said first band gap altering material comprises germanium.

3. The heterojunction bipolar transistor of claim 1 wherein said diffusion suppressant comprises carbon.

4. The heterojunction bipolar transistor of claim 1 wherein said first band gap altering material comprises germanium and wherein said diffusion suppressant comprises carbon.

5. The heterojunction bipolar transistor of claim 1 wherein said base dopant is boron.

6. The heterojunction bipolar transistor of claim 1 wherein said diffusion suppressant is carbon and wherein said base dopant is boron.

7. The heterojunction bipolar transistor of claim 2 wherein said third depth is situated in a germanium plateau region in said base.

8. The heterojunction bipolar transistor of claim 1 wherein said band gap increases at a linear rate between said first depth and said second depth, wherein said first depth is situated between said third depth and said second depth.

9. The heterojunction bipolar transistor of claim 1 wherein said concentration of said diffusion suppressant decreases between said third depth in said base and said fourth depth so as to counteract a change in said band gap in said base at approximately said second depth.

10. The heterojunction bipolar transistor of claim 1 wherein said heterojunction bipolar transistor is an NPN silicon-germanium heterojunction bipolar transistor.

11. The heterojunction bipolar transistor of claim 1 wherein said concentration of said diffusion suppressant decreases at a linear rate between said third depth and said fourth depth.

12. The heterojunction bipolar transistor of claim 1 wherein said concentration of said band gap altering material decreases at a linear rate between said first depth and said second depth.

* * * * *